United States Patent [19]

Bensussan et al.

[11] 4,069,456

[45] Jan. 17, 1978

[54] MICROWAVE SYSTEMS FOR ELIMINATING SPURIOUS SIGNALS FROM PULSED SOURCE

[75] Inventors: Andre Bensussan; Claude Levaillant, both of Paris, France

[73] Assignee: C.G.R. MeV, France

[21] Appl. No.: 668,654

[22] Filed: Mar. 19, 1976

[30] Foreign Application Priority Data

Mar. 21, 1975 France ............................... 75 08947

[51] Int. Cl.$^2$ ............................................... H03H 7/04

[52] U.S. Cl. ........................................ 328/165; 333/6; 333/73 W; 333/76

[58] Field of Search ............... 333/1.1, 6, 73 W, 24 R, 333/76, 24.2; 325/123, 124, 130, 323, 324, 473, 477; 328/162, 167, 165; 331/76, 77

[56] References Cited

U.S. PATENT DOCUMENTS

| | | | |
|---|---|---|---|
| 2,981,837 | 4/1961 | Ruthroff | 333/1.1 UX |
| 3,324,419 | 6/1967 | Kuroda et al. | 333/24 R X |

*Primary Examiner*—Paul L. Gensler

*Attorney, Agent, or Firm*—Oblon, Fisher, Spivak, McClelland & Maier

[57] ABSTRACT

Selective transmission systems for transmitting from an H.F. generator to a load device whose electrical characteristics may vary rapidly, a pulsed main H.F. signal of given frequency, and for eliminating the spurious signal or signals accommpanying the main H.F. signal at the beginning of the pulse, when the load impedance presented to the H.F. generator is not suitable. Several embodiments are described which take account of the frequency of the spurious signals in relation to the frequency of the main signal.

7 Claims, 8 Drawing Figures

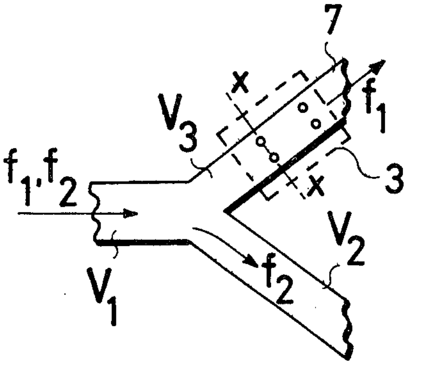
FIG. 3
FIG. 4
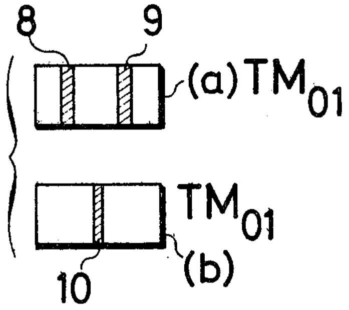
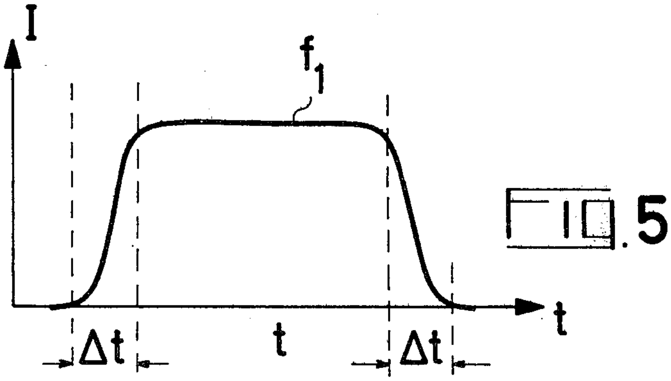
FIG. 5

MICROWAVE SYSTEMS FOR ELIMINATING SPURIOUS SIGNALS FROM PULSED SOURCE

Microwave transmission systems arranged between a microwave power source (a klystron or a magnetron for example) and a load device (for example a particle accelerator), must possess certain properties, and in particular should have a suitable load impedance at the H.F. source input, in order to prevent deflective operation or even impairment of said H.F. source.

In fact, the load impedance is determined by the electrical characteristics of the load device (accelerator for example) to which the transmission line is connected, these characteristics being capable of acquiring widely varying values when the accelerator is started.

In other words, the load impedance presented by the accelerator section to the H.F. generator, varies substantially according to the "state" of the resonant cavity forming said accelerator section (the cavity may or may not be loaded by the particle beam and may or may not be supplied with H.F. energy, as is the case with pulse generators). The variation in the load impedance of the H.F. generator can give rise to a variation in the operating frequency of the generator, can bring about a variation in the amplitude of the emitted H.F. wave and can promote the formation of spurious oscillations corresponding to an operating mode other than the selected one.

Various solutions have been proposed to this problem, in particular the inclusion of a unidirectional ferroelectric element in the transmission line. But this unidirectional element, more often than not, does not make it possible to achieve appropriate matching of the generator at the beginning of the pulse when said H.F. pulse is applied to the accelerator.

The present invention makes it possible to transmit to a load device a pulse H.F. signal of given frequency and to eliminate the spurious signal or signals which may accompany or even replace the H.F. signal at the start of the pulse, if the load impedance presented to the H.F. generator does not have an appropriate value throughout the duration of the pulse.

In accordance with the invention, a selective transmission system for transmitting pulsed H.F. signals emitted by an H.F. generator and designed for injection into a load device, said H.F. generator being capable of emitting a first signal known as the main signal of predetermined frequency and at least one second signal which is a spurious signal, said selective transmission system comprising, means for selectively transmitting to said load device said first signal, by eliminating said spurious signal and further means which make it possible to present to the H.F. generator a suitable load impedance throughout the time of the pulse, said further means comprising at least an hyperfrequency unidirectional element of isolator type.

For a better understanding of the invention and to show how the same may be carried into effect, reference will be made to the drawings, given solely by way of example, which accompany the following description, and wherein:

FIGS. 3 and 4 illustrate details of the embodiment shown in FIG. 1.

FIG. 5 illustrates an example of a pulsed H.F. signal for transmission.

Figure 1:
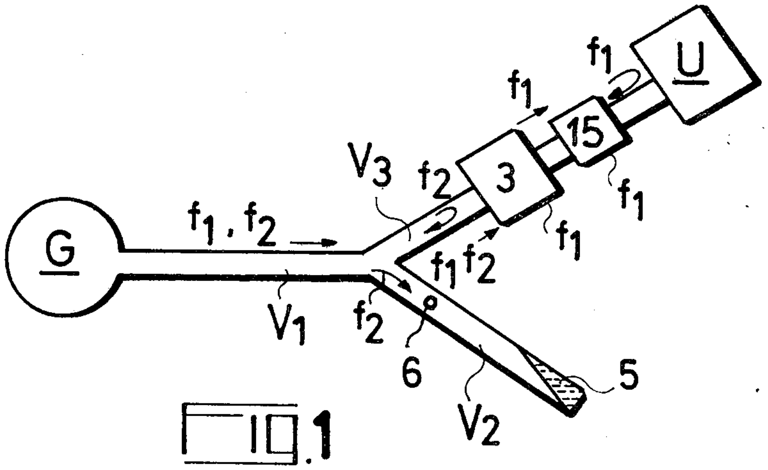
FIGS. 1 and 2 illustrate two examples of transmission systems in accordance with the invention.

In one embodiment, the transmission system in accordance with the invention, as shown in FIG. 1, lends itself particularly well to the transmission of a microwave comprising a first signal known as the main signal, of frequency $f_1$, and a second signal which is a spurious signal, of frequency $f_2$ differing from that $f_1$ ($f_1$ = 3000 MHz and $f_2$ = 4300 MHz, for example).

Figure 2:
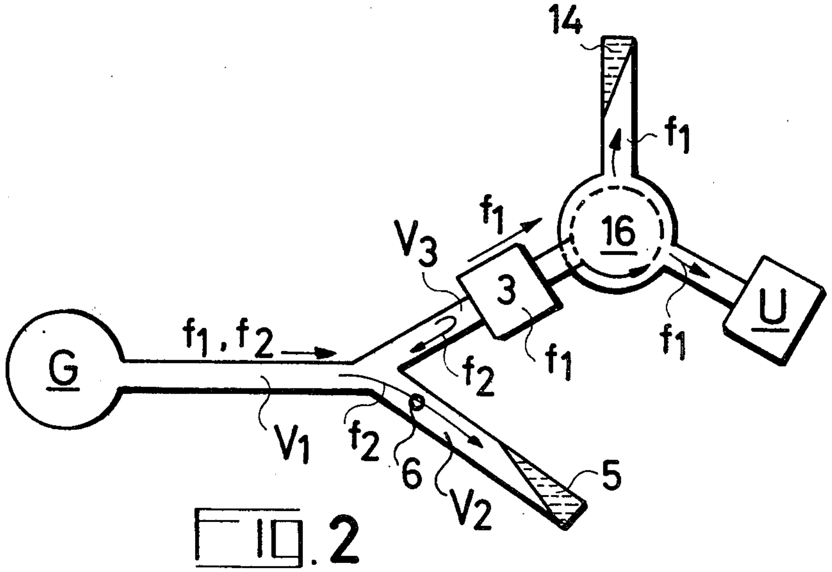

This transmission system comprises a three-way junction, with the channels $V_1$, $V_2$, $V_3$ formed by waveguides arranged in a Y relationship for example. The first channel $V_1$ or the input channel, is connected to a microwave generator G (for example a magnetron) operating in pulsed fashion. The second channel $V_2$ is provided at its end with a microwave absorber 5 (a water wedge for example) which makes it possible to absorb the spurious signal of frequency $f_2$. In the third channel $V_3$, connected to the load device U, a band-pass filter 3 is arranged, this being centred on the frequency $f_1$, and an unidirectional element, either a microwave isolator 15 (FIG. 1) whose reverse attenuation is at a peak for the frequency $f_1$, or a microwave circulator 16 (FIG. 2) centred on the frequency $f_1$.

The dimensions of the waveguide constituting the second channel $V_2$, may be chosen in such a way that this waveguide acts as a cut-off waveguide in relation to the signal of frequency $f_1$. Moreover, matching means (for example a mobile rod 6) can be arranged in the channel $V_2$ in order to accurately regulate the load impedance of the generator G. If the waveguide forming the channel $V_2$ does not act as a cut-off waveguide in relation to the signal of frequency $f_1$, a band-pass filter (not shown in the fig.) can be placed in the channel $V_2$, this filter being centred on the frequency $f_2$.

In operation, when the generator G emits a pulse constituted by signals of frequency $f_1$ and $f_2$, or by one of these signals only, the load device U (the accelerator section coupled to the channel $V_3$, in the example under consideration) behaves during the time $\delta t$ of the rise portion of the pulse envelope, as a totally reflecting element. The signal of frequency $f_1$, having passed through the filter 3 and the insulator 15, is then reflected by the load device U and heavily attenuated by the insulator 15 (reverse attenuation). On the other hand, the major part of the signal of frequency $f_2$ passes through the channel $V_2$ and is absorbed by the absorber 5. During the time $\Delta t$ covered by the plateau portion of the pulse envelope, the signal of frequency $f_1$ is transmitted to the load device U. Thus, throughout the whole of the time of the pulse, including the rise time $\delta t$, the load impedance presented to the generator G has an appropriate value (FIG. 5).

FIG. 3 illustrates an example of a filter 3 for a given mode of operation ($TM_{01}$ mode). In the waveguide 7 doing duty as the channel $V_3$ of the junction, obstacles 8 and 9 FIG. 4 (a) or 10 FIG. 4 (b), constituted by rods disposed parallel to the electric field, are arranged. If the possible modes of propagation of the microwave are the $TM_{01}$ or $TM_{02}$ modes, then the arrangement of the obstacles 8 and 9 as shown in FIG. 4 (a) is the preferred one rather than that shown in FIG. 4 (b) which favours the $TM_{02}$ mode.

Figure 6:
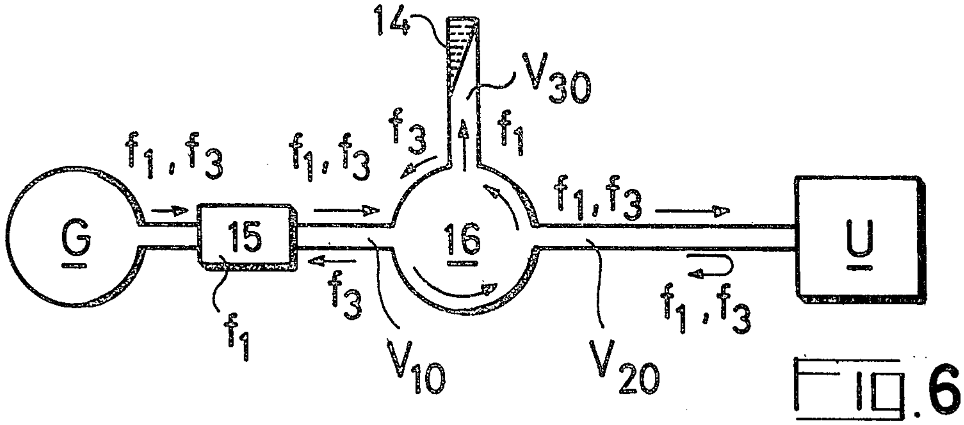
FIGS. 6, 7 and 8 are three other embodiments of transmission systems in accordance with the invention.

The transmission system in accordance with the invention as shown in FIG. 6, will preferably be used when the frequency $f_3$ of the spurious signal emitted by the generator G is close to the effective frequency $f_1$ ($f_1$ = 3000 MHz; $f_3$ = 3150 MHZ).

This transmission system comprises an isolator 15 of the ferrite-isolator type for example centred on the frequency $f_1$, a three-channel circulator 16 with the channels $V_{10}$, $V_{20}$, $V_{30}$, centred on the frequency $f_1$, the channel $V_{10}$ connecting the circulator 16 to the isolator 15, the channel $V_{20}$ being connected to the load device U and the channel $V_{30}$ being provided at the end with a microwave absorber 14.

In operation, during the time $\delta t$ of the rise portion of the envelope (FIG. 5), the signals $f_1$ and $f_3$ ($f_1$ being the frequency of the signal used by the accelerator), after having successively passed through the isolator 15 and the circulator 16, are reflected by the load device U and supplied to the absorber 14 which absorbs the signal of frequency $f_1$ and directs to the isolator 15 the signal of frequency $f_3$ which is heavily attenuated.

Figure 7:
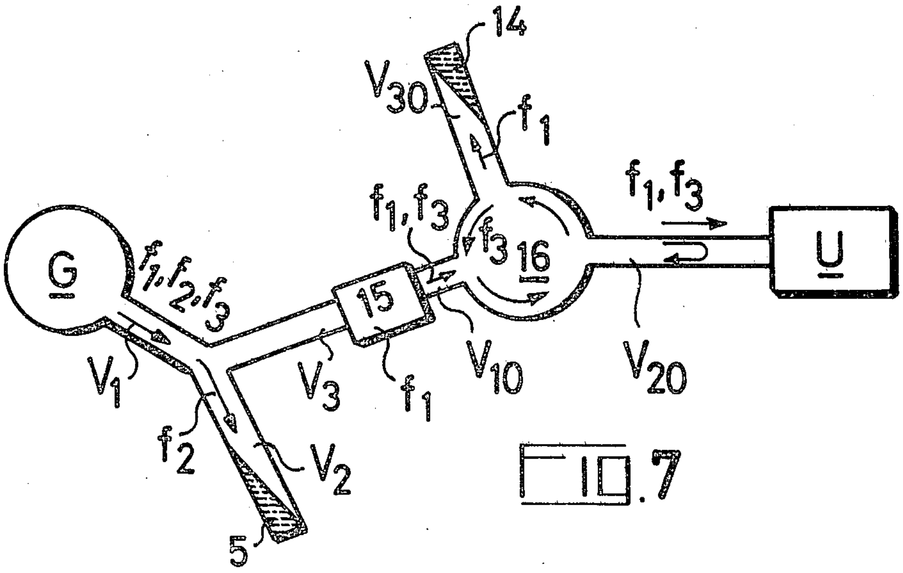

When the generator G is likely to emit, in addition to the main signal of frequency $f_1$, spurious signal whose frequency $f_2$ is substantially different from frequency $f_1$ and a further spurious signal whose frequency $f_3$ is quite close to the frequency $f_1$, the transmission system in accordance with the invention can be designed in the manner shown in FIG. 7. This transmission system comprises a Y-junction with three channels $V_1$, $V_2$ and $V_3$. The channel $V_2$ is provided at its end with an absorber 5 which absorbs the signal of frequency $f_2$. The channel $V_2$ is equipped either with a band-pass filter (not shown in the fig.) centred on the frequency $f_2$ or (as shown in FIG. 7) is designed as a waveguide whose dimensions cause it to act as a cut-off waveguide in relation to the signals of frequencies $f_1$ and $f_3$. The channel $V_3$ or load channel, is equipped with an isolator 15 centred on the frequency $f_1$ and followed by a three-channel circulator 16 with the channels $V_{10}$ (following the isolator 15), $V_{20}$, $V_{30}$, the frequency of operation of the circulator 16 being centred on the frequency $f_1$. The channel $V_{20}$ is connected to the load device U and the channel $V_{30}$ is provided at its end with a microwave absorber 14 which absorbs the signal of frequency $f_1$ reflected by the load device U during the time $\delta t$ of the rise portion of the pulse envelope. The signal of frequency $f_3$ which is reflected, returns towards the isolator 15 where it is heavily attenuated.

Figure 8:
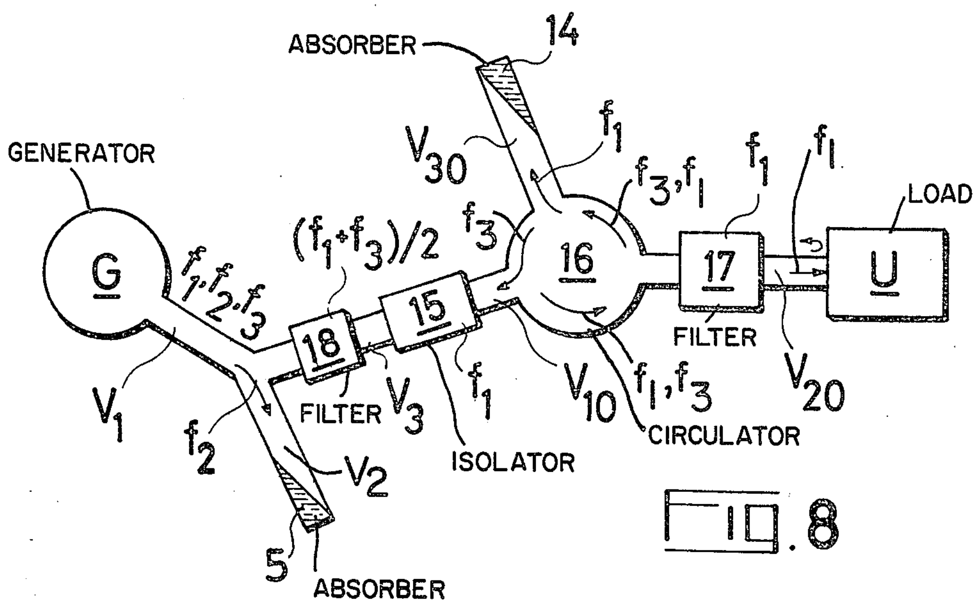

A band-pass filter 17 centred on the frequency $f_1$ (FIG. 8) can be arranged in the channel $V_{20}$ of the circulator 16. A band-pass filter 18 centred on the frequency $(f_1 + f_3)/2$ can also be arranged up-circuit of the H.F. isolator 15.

Finally, we should point out that in a variant embodiment of the transmission system in accordance with the invention, the absorber 5 shown in FIG. 1 could be replaced by a matched load preceded by a mobile rod disposed parallel to the electric field and acting as a variable obstacle in order to enable better matching of the generator G to be achieved, especially where the latter is a magnetron.

What we claim is:

1. A selective transmission system for transmitting pulsed H.F. signals emitted by an H.F. generator and designed for injection into a load device, said H.F. generator being capable of emitting a first signal known as the main signal, of given frequency, and at least one second signal which is a spurious signal, said selective transmission system comprising means for eliminating said spurious signal and selectively transmitting to said load device said first signal and further means for presenting to the H.F. generator a matched load impedance throughout the time of the pulse, said further means comprising at least an hyperfrequency unidirectional element of the isolator type, said selective transmission system further comprising at least a three-channel junction having a first channel receiving said signals of frequency $f_1$ (main signal) and $f_2$ (spurious signal) emitted by said generator, a second channel which is equipped at its end with a microwave absorber and means for the selective transmission of the spurious signal of frequency $f_2$ to said absorber, and a third channel which is provided with a band-pass filter centered on said main frequency $f_1$, and with said hyperfrequency unidirectional element centred on said main frequency $f_1$, said third channel being connected to said load device, said second channel being constituted by a waveguide which is a cut-off waveguide in relation to said main signal.

2. A selective transmission system as claimed in claim 1, wherein said unidirectional element of the H.F. isolator type is connected to a further unidirectional element of the circulator type.

3. A selective transmission system as claimed in claim 2, wherein: said further unidirectional element of the circulator type includes three channels constituted by three waveguides, the first waveguide receiving said signal of frequency $f_1$ (main signal) and a further spurious signal of frequency $f_3$ and being coupled with said H.F. isolator centered on said frequency $f_1$, the second waveguide being connected to said load device and the third waveguide being provided at its end with a H.F. absorber making it possible to eliminate a portion of said main signal, of frequency $f_1$ reflected by the load device, and wherein a portion of said signal of frequency $f_3$, reflected toward said generator is eliminated by reverse attenuation in said isolator.

4. A selective transmission system as claimed in claim 3, wherein a band-pass H.F. filter centered on said frequency $f_1$, is arranged down-circuit of said circulator in said second waveguide which is connected to the load device.

5. A selective transmission device for transmitting pulsed H. F. signals emitted by an H. F. generator and designed for injection into a load device, said H. F. generator being capable of emitting a first signal known as the main signal, of given frequency, and at least one second signal which is a spurious signal, said selective transmission system comprising means for eliminating said spurious signal and selectively transmitting to said load device said first signal and further means for presenting to the H. F. generator a matched load impedance throughout the time of the pulse, said further means comprising at least an hyperfrequency unidirectional element of the isolator type centered on said frequency $f_1$, said selective transmission system further comprising at least a three-channel junction having a first channel receiving said signals of frequency $f_1$ (main signal) and $f_2$ (spurious signal) emitted by said generator, a second channel which is equipped at its end with a microwave absorber and means for the selective transmission of the spurious signal of frequency $f_2$ to said absorber, said second channel being further provided with matching means for modifying the load impedance of said generator, said matching means being constituted by metal obstacles arranged in said waveguide of said second channel, in a direction which is parallel to the electric field in said waveguide, and a third channel provided with a band-pass filter centered on said main frequency $f_1$, said third channel being connected to said load device, and a further unidirectional element of the circulator type connected to said unidirectional element of the H. F. isolator type.

6. A selective transmission system as claimed in claim 5, wherein a band-pass H. F. filter which passes said signals of frequencies $f_1$ and $f_3$, is arranged up-circuit of said isolator which is centred on said frequency $f_1$.

7. A selective transmission system as in claim 5, wherein: said H. F. generator produces a second spurious signal $f_3$ in addition to said spurious signal $f_2$, said frequency $f_2$ being substantially different from said frequency $f_1$ and said frequency $f_3$ being relatively close to said frequency $f_1$, and wherein, said third channel of said three-channel junction is coupled to said H. F. isolator.

* * * * *